(12) United States Patent
Hosokubo

(10) Patent No.: US 7,330,466 B2
(45) Date of Patent: Feb. 12, 2008

(54) PCM-BASED DATA TRANSMISSION SYSTEM AND METHOD

(75) Inventor: Takao Hosokubo, Shizuoka (JP)

(73) Assignee: NEC Corporation, Tokyo (JP)

( * ) Notice: Subject to any disclaimer, the term of this patent is extended or adjusted under 35 U.S.C. 154(b) by 544 days.

(21) Appl. No.: 11/047,677

(22) Filed: Feb. 2, 2005

(65) Prior Publication Data

US 2005/0169320 A1  Aug. 4, 2005

(30) Foreign Application Priority Data

Feb. 3, 2004   (JP)   ............................ 2004-026357

(51) Int. Cl.
   *H04L 12/66*   (2006.01)
(52) U.S. Cl. ...................... 370/352; 370/389; 375/240; 375/241
(58) Field of Classification Search ...................... None
   See application file for complete search history.

(56) References Cited

U.S. PATENT DOCUMENTS 5,742,135 A * 4/1998 Horst .......................... 375/354
6,438,158 B1 * 8/2002 Zhou et al. ................... 375/222
6,463,103 B1 * 10/2002 Dong et al. ................... 375/242
6,985,094 B2 * 1/2006 Kem ............................. 341/58
7,221,711 B2 * 5/2007 Woodworth ................ 375/246
2001/0038673 A1 * 11/2001 Olafsson .................... 375/354

FOREIGN PATENT DOCUMENTS

JP   63-69364 A   3/1988
JP   5-227119 A   9/1993

* cited by examiner

*Primary Examiner*—Bob A. Phunkulh
(74) *Attorney, Agent, or Firm*—Sughrue Mion, Pllc.

(57) ABSTRACT

A transmitting terminal generates a stream of a given number of PCM codes whose polarity bits are each fixed at "1", and transmits it to a receiving terminal. Subsequently, the transmitting terminal creates a data PCM stream made of full-bit PCM codes by fixing the polarity bit of each PCM code at "1" and by sequentially allocating the remaining bits to transmission data, and transmits it to the receiving terminal. The receiving terminal determines whether the polarity bit of each PCM code in a received PCM stream is "1", and counts the number of consecutive PCM codes whose polarity bits are "1". When the count value becomes equal to or more than the given number, reception data is rearranged from the remaining bits other than the polarity bit of each PCM code in a subsequently received PCM stream.

12 Claims, 4 Drawing Sheets

PCM-BASED DATA TRANSMISSION SYSTEM AND METHOD

BACKGROUND OF THE INVENTION

1. Field of the Invention

The present invention relates to a PCM (Pulse Code Modulation)-based communications system and, more particularly, to a system and a method which enable data to be transmitted and received using PCM coding.

2. Description of the Related Art

In recent years, as IP networks advance, the VoIP (Voice over IP) technologies are becoming important factors in network communications. In parallel, there is a growing trend among VoIP telephony service providers to guarantee communication quality by employing the PCM-based recommendation G. 711 as a voice encoding method and securing a bandwidth for UDP (User Datagram Protocol) packets. Meanwhile, as mobile telephones, or those with digital cameras, become widespread, the uses of the service of transmitting instant messages, still images and the like are dramatically increasing in number.

Therefore, there is a need for a simple data-transmission technology that places no burden on a network. In ISDN (Integrated Services Digital Network), a B channel enables both a conversation service and a data communication service to be used. However, it has a problem that a burden on a network is increased because there is a need to setting a service mode per call at the network side.

As a method for switching between communication modes (voice communication mode and data communication mode) on the terminal sides without network-side control, for example, Japanese Patent Unexamined Application Publication No. S63-69364 discloses a communication mode switching system. According to this prior art, switching control is performed as follows. When switching to the data communication mode during the voice communication mode, the switching is done by transmitting a signal that can pass through a voice band, such as a multifrequency signal or a push-button signal. When switching to the voice communication mode during the data communication mode, the switching is done by transmitting a specific signal code.

However, according to this communication mode switching system as disclosed, a special control signal (such as the push-button signal or the specific signal code), apart from communicated information, is transmitted to the other end of a line through a network, increasing the traffic on the network. In addition, in the above-mentioned prior art, no consideration is given to PCM-based voice communications.

SUMMARY OF THE INVENTION

It is an object of the present invention to provide a new data transmission system and method utilizing PCM coding without placing a burden on a network.

Moreover, it is another object of the present invention to provide a new communication mode switching method using PCM coding without the need of network-side control.

In PCM voice communications, usually PCM-encoded is an analog signal whose bandwidth has been restricted to a range from 300 Hz to 4000 Hz by using a band pass filter. Based on this fact, the present inventor turned his attention to the point that a band below the lowest frequency can be used for data transmission. For example, switching between voice communication and data communication can be controlled by utilizing the most significant bit, which indicates the polarity of PCM code. In particular, by utilizing the fact that there is no occurrence of a PCM stream in which the polarity bits are consecutively "1" for a given period of time or more, it is possible to switch from voice conversation to data transmission at any time in an automatic manner.

According to the present invention, a transmitting terminal transmits a PCM stream composed of a plurality of PCM codes and, when inputting data to be transmitted, transmits a predetermined number of consecutive PCM codes each having a polarity bit fixed to a predetermined logic value, to a receiving terminal. The receiving terminal, when receiving a PCM stream from the transmitting terminal, determines whether the polarity bit of each PCM code in a received PCM stream is the predetermined logic value. After the polarity bits of the predetermined number of consecutive PCM codes in the received PCM stream are the predetermined logic values, the receiving terminal rearranges bit data other than the polarity bit in each PCM code of the received PCM stream into received data.

As described above, by fixing the polarity bits (e.g. most significant bits) of a plurality of consecutive PCM codes at a predetermined logic value, it is possible to notify a destination terminal of changing a communication mode from voice transmission mode to data transmission. In other words, the control of data transmission can be performed based on PCM codes which are the same as general PCM code.

According to an aspect of the present invention, the transmitting terminal inputs data to be transmitted and thereby generates a data PCM stream composed of PCM codes with each PCM code having a polarity bit fixed to a predetermined logic value and the remaining bits to which the data to be transmitted are sequentially allocated. The data PCM stream is transmitted to the receiving terminal. The receiving terminal, when receiving a PCM stream from the transmitting terminal, determines whether the polarity bit of each PCM code in a received PCM stream is the predetermined logic value. When the polarity bit of the PCM code in the received PCM stream is the predetermined logic value, the receiving terminal rearranges bit data other than the polarity bit in the PCM code of the received PCM stream into received data.

It is possible for the transmitting terminal, when receiving the input of the data to transmit, to create a stream of a given number of PCM codes in which the polarity bit of each PCM code is fixed at the predetermined logic value, to transmit this stream to the receiving terminal, and then to transmit the data PCM stream after transmitting the stream of the given number of the PCM codes. In this case, the receiving terminal counts the number of consecutive PCM codes whose polarity bits are the predetermined logic value, in the received PCM stream. When the count value is equal to or more than the given number, the receiving terminal reconstructs reception data from the remaining bits other than the polarity bit of each PCM code in a subsequently received PCM stream.

When switching from normal PCM transmission (i.e., voice conversation or the like) to data transmission, a given number of PCM codes whose polarity bits are fixed at a predetermined logic value are transmitted to the receiving terminal in advance, whereby the receiving terminal can automatically switch its receiving mode.

Another aspect of the present invention is a method for switching between communication modes, performed on terminals in a system for transmitting data from a transmitting terminal to a receiving terminal through a network by using a PCM (Pulse Code Modulation) stream. According to this method, the transmitting terminal creates from an analog signal a first PCM stream made of full-bit PCM codes each including a polarity bit, and creates a second PCM stream by fixing the polarity bit of each PCM code at a predetermined logic value and by sequentially allocating the remaining bits other than the polarity bit to data to transmit. When the data to transmit occurs, the transmitting terminal creates a stream of a given number of PCM codes in which the polarity bit of each PCM code is fixed at the predetermined logic value, transmits this stream of the given number of the PCM codes to the receiving terminal, and thereafter switches streams to transmit, from the first PCM stream to the second PCM stream. The receiving terminal receives a PCM stream from the transmitting terminal, determines whether or not the polarity bit of each PCM code in the received PCM stream is the predetermined logic value, and counts the number of consecutive PCM codes whose polarity bits are the predetermined logic value in the received PCM stream. When the count value is less than the given number, the receiving terminal PCM-decodes the received PCM stream. When the count value is not less than the given number, the receiving terminal reconstructs reception data from the remaining bits other than the polarity bit of each PCM code in the received PCM stream.

As described above, according to the present invention, the polarity bits of full-bit PCM codes are utilized as control data, and a bit stream made of the remaining bits is recognized as meaningful data to be transmitted. This makes it possible to switch between communication modes, as well as to transmit data, within a voice bandwidth secured on a network, without using a control channel of the network. Consequently, an increase in the traffic on the network can be suppressed without placing a burden on the network.

BRIEF DESCRIPTION OF THE DRAWINGS

DETAILED DESCRIPTION OF THE PREFERRED EMBODIMENTS (1) PCM Stream Transmitting Section FIG. 1 is a block diagram showing a PCM stream transmitting section of a transmitting-side terminal 10 in a data transmission system according to a first embodiment of the present invention. Here, it is assumed that a line is established between the transmitting-side terminal 10 and a receiving-side terminal 30 through a digital switching network 20. For the simplicity of the drawing, FIG. 1 only shows the PCM stream transmission-related configuration of the transmitting-side terminal 10, omitting a receiving section and the like of this terminal 10.

Referring to FIG. 1, the transmitting-side terminal 10 can transmit and receive a PCM stream, which will be described later, by using a transmitter/receiver 101 through the line established over the digital switching network 20. A timing signal generator 102 extracts a network synchronization signal from the digital switching network 20 and generates an 8-kHz sampling signal $S_S$, a frame signal $S_F$ and an 8-bit transmission timing signal $S_{T8}$. Based on the frame signal $S_F$ and 8-bit transmission timing signal $S_{T8}$, a MSB (Most Significant Bit) timing decimator 103 creates a 7-bit transmission timing signal $S_{T7}$ by decimating only the timing pulses corresponding to the most significant bits MSB in the 8-bit transmission timing signal $S_{T8}$.

Figure 1:
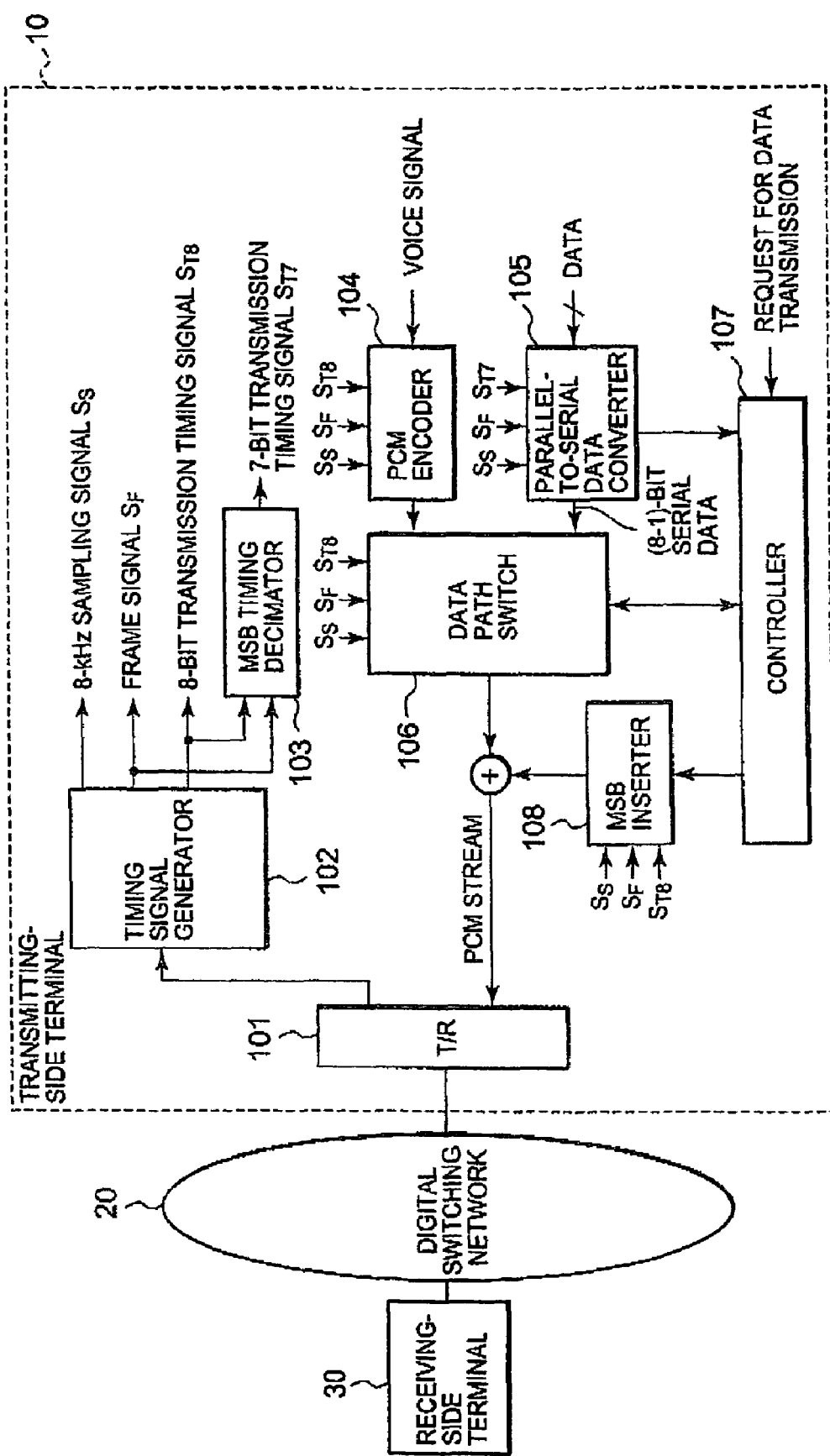
FIG. 1 is a block diagram showing a PCM stream transmitting section of a transmitting-side terminal in a data transmission system according to a first embodiment of the present invention.

The transmitting-side terminal 10 is provided with a PCM encoder 104, which performs PCM coding of an analog voice signal which has been restricted to a bandwidth from 300 Hz to 4000 Hz by using a band pass filter. In synchronization with the 8-kHz sampling signal $S_S$, frame signal $S_F$ and 8-bit transmission timing signal $S_{T8}$ fed from the timing signal generator 102, the PCM encoder 104 quantizes an inputted analog voice signal by using a predetermined companding method, and creates an 8-bit PCM stream.

Parallel-to-Serial Data Conversion

The transmitting-side terminal 10 is also provided with a parallel-to-serial data converter 105, which converts parallel data, inputted from a computer or the like, to serial data. In synchronization with the 8-kHz sampling signal $S_S$ and frame signal $S_F$ fed from the timing signal generator 102, and with the 7-bit transmission timing signal $S_{T7}$ fed from the MSB timing decimator 103, the parallel-to-serial data converter 105 converts inputted parallel data to (8-1)-bit serial data. Here, the (8-1)-bit serial data is defined as pseudo 8-bit serial data created by reading 8-bit parallel data in accordance with the 7-bit transmission timing signal $S_{T7}$ generated by decimating only the timing pulses corresponding to the most significant bits in the 8-bit transmission timing signal $S_{T8}$. The (8-1)-bit serial data has the most significant bit of eight bits set to a high-impedance state and the remaining seven bits as significant data.

The parallel-to-serial data converter 105 can be configured by using a parallel input/serial output shift register, for example. Parallel data is inputted into the shift register in synchronization with the 8-kHz sampling signal $S_S$ or frame signal $S_F$. The inputted data is sequentially shifted out by seven bits obtained by delaying the 8-bit inputted data by one bit corresponding to the timing of its most significant bit in synchronization with the 7-bid transmission timing signal $S_{T7}$ which is generated by decimating only the timing pulses corresponding to the most significant bits in the 8-bit transmission timing signal $S_{T8}$. In this way, the parallel data can be converted into the (8-1)-bit serial data in which each most significant bit is in a high-impedance state.

The 8-bit PCM stream, which is the output from the PCM encoder 104, and the (8-1)-bit serial data, which is the output from the parallel-to-serial data converter 105, are outputted to a data path switch 106. The data path switch 106 outputs a selected one of the 8-bit PCM stream and the (8-1)-bit serial data depending on the control by a controller 107, in synchronization with the 8-kHz sampling signal $S_S$, frame signal $S_F$ and 8-bit transmission timing signal $S_{T8}$ fed from the timing signal generator 102.

The controller 107, even during voice communications, performs data transmission in response to a request for data transmission from a computer. Therefore, when voice is transmitted, the controller 107 controls the data path switch 106 so that it selects the 8-bit PCM stream from the PCM encoder 104, and when a request for data transmission occurs, the controller 107 controls the data path switch 106 so that it selects the (8-1)-bit serial data from the parallel-to-serial data converter 105. The data transmission rate is, for example, 56 kbps.

MSB Insertion

Further, when the request for data transmission occurs, the controller 107 also controls a MSB inserter 108 so that it transmits PCM codes indicative of data transmission.

Prior to transmitting data, the MSB inserter 108, under control of the controller 107, inserts Is into consecutive PCM codes at the most significant bits (MSBs) thereof, in at least a given number $N_F$ of frames. Subsequently, when the (8-1)-bit serial data is outputted from the data path switch 106, the MSB inserter 108 inserts 1s into the (8-1)-bit serial data at the timings of the most significant bits. More specifically, in synchronization with the 8-kHz sampling signal $S_S$, frame signal $S_F$ and 8-bit transmission timing signal $S_{T8}$ fed from the timing signal generator 102, the MSB inserter 108 inserts 1s into at least the given number $N_F$ of frames at the MSB timings, and also inserts Is into the subsequent (8-1)-bit serial data at the most significant bit timings. In this way, a PCM stream in which the most significant bits are always "1" is transmitted from the transmitter/receiver 101 to the digital switching network 20.

As mentioned earlier, since a voice bandwidth for conversation using PCM codes is from 300 Hz to 4000 Hz, a frequency band below 300 Hz can be used for data transmission. Utilizing this fact, in this embodiment, the starting of data communication is notified to the receiving side by fixing the most significant bits, which indicate the level polarities of respective PCM codes, at "1" in at least $N_F$ frames corresponding to a given period of time. The given period of time is an interval, represented by the number of frames, which is equivalent to a half-wave interval of the lowest voice-band frequency. For the number $N_F$ of frames, used is the smallest integer not less than a value a obtained by the following equation (in this embodiment, $N_F$=14):

$$a = (1/\text{lowest voice-band frequency})/$$
$$(1/\text{sampling frequency})/2$$
$$= (1/300 \text{ Hz})/(1/8 \text{ kHz})/2$$
$$= 13.33$$

When the data transmission is completed and the communication state returns to voice conversation, the controller 107 controls the MSB inserter 108 so that it stops the operation of inserting "1" in the most significant bit. By this control, a voice PCM stream of negative polarity, in which the most significant bits are "0", is outputted from the data path switch 106 and then transmitted as it is.

Accordingly, the receiving side can determine whether or not the communication mode is switched from voice communication to data communication by monitoring the most significant bits of PCM codes for the given period of time. Further, the receiving side can determine whether or not the communication mode is switched from the data communication to the voice communication, based on a change in the most significant bits, from a state of being consecutively 1s to a state of 0. Note that this technique is effective in any of the encoding laws, A-law and μ-law, because the most significant bit of a PCM code is for indicating the polarity of the signal level. Next, a detailed description will be given of the receiving-side terminal, which has the voice/data switching determination means as mentioned above.

(2) PCM Stream Receiving Section

Figure 2:
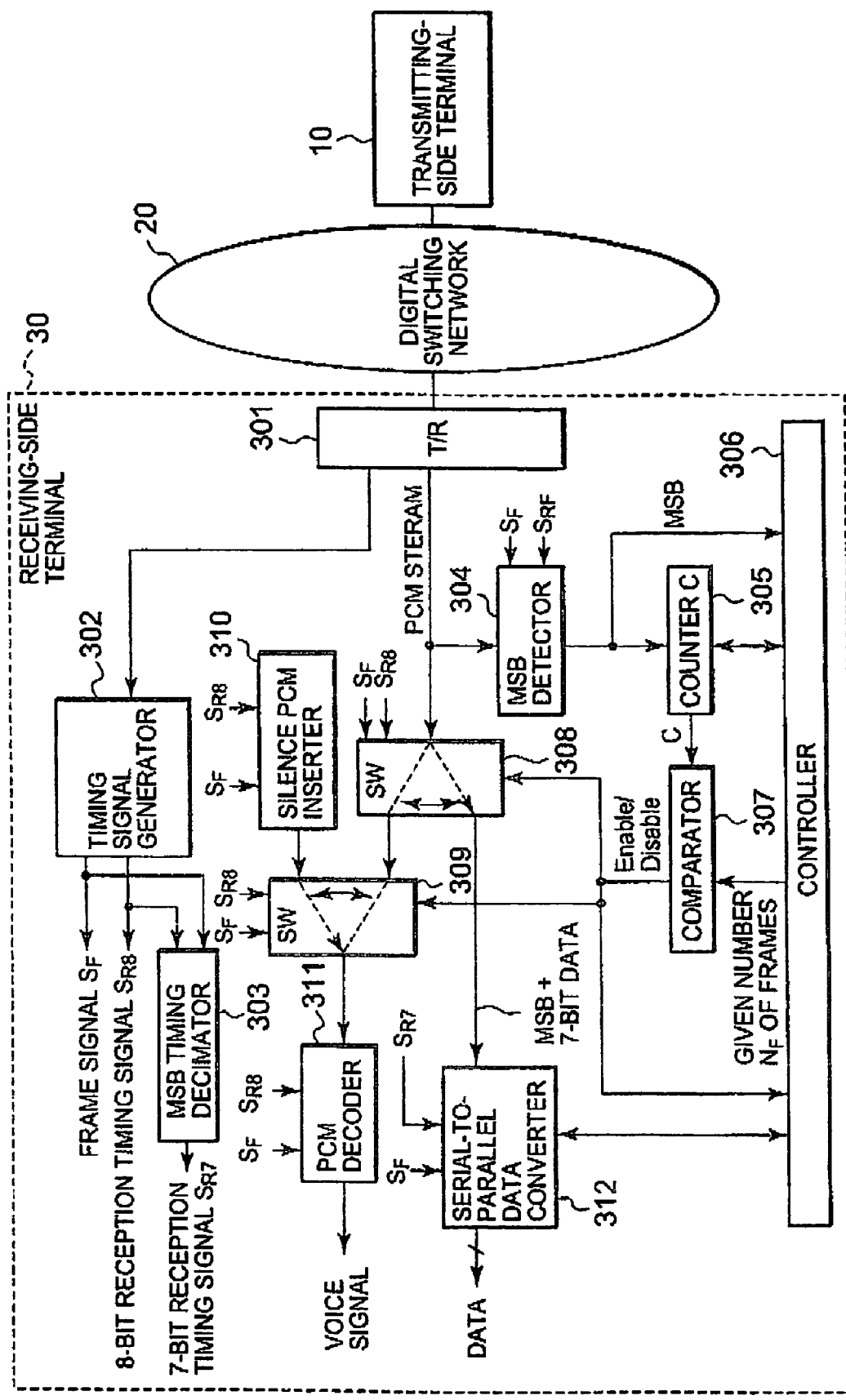
FIG. 2 is a block diagram showing a PCM stream receiving section of a receiving-side terminal in the data transmission system according to the first embodiment of the present invention.

FIG. 2 is a block diagram showing a PCM stream receiving section of the receiving-side terminal 30 in the data transmission system according to the first embodiment of the present invention. For the simplicity of the drawing, FIG. 2 only shows the PCM stream reception-related configuration of the receiving-side terminal 30, omitting a transmitting section and the like of this terminal 30.

Referring to FIG. 2, the receiving-side terminal 30 can transmit and receive a PCM stream, which will be described later, by using a transmitter/receiver 301 through a line established over the digital switching network 20. A timing signal generator 302 extracts a network synchronization signal from the digital switching network 20 and generates a frame signal $S_F$ and an 8-bit reception timing signal $S_{R8}$. Based on the frame signal $S_F$ and 8-bit reception timing signal $S_{R8}$, a MSB timing decimator 303 creates a 7-bit reception timing signal $S_{R7}$ by decimating only the timing pulses corresponding to the most significant bits (MSBs) in the 8-bit reception timing signal $S_{R8}$.

MSB Detection

A PCM stream, received by the transmitter/receiver 301, is outputted to a MSB (Most Signification Bit) detector 304 and a data path switch 308. In synchronization with the frame signal $S_F$ and 8-bit reception timing signal $S_{R8}$ fed from the timing signal generator 302, the MSB detector 304 monitors the most significant bit MSB in each frame of the received PCM stream and outputs the value (1/0) of each most significant bit MSB to a counter 305 and a controller 306.

The counter 305 counts the number of most significant bits of "1" and outputs the count value C to a comparator 307. The comparator 307 compares the count value C with the given number $N_F$ (of frames). The comparator 307 outputs an Enable signal or a Disable signal depending on whether or not the count value C has reached the given number $N_F$ and outputs the Enable/Disable signal to the data path switch 308, another data path switch 309 and the controller 306. As will be described later, the Disable signal indicates the reception of voice, and the Enable signal indicates the reception of data.

Data Path Switching

The data path switches 308 and 309 concurrently execute switching operation in accordance with the Enable signal or Disable signal received from the comparator 307, in synchronization with the frame signal $S_F$ and 8-bit reception timing signal $S_{R8}$ fed from the timing signal generator 302. More specifically, the data path switch 308 executes the switching operation so as to output the received PCM stream to the data path switch 309 when receiving the Disable signal from the comparator 307, and to output the received PCM stream to a serial-to-parallel data converter 312 when receiving the Enable signal. On the other hand, the data path switch 309 executes the switching operation so as to output the received PCM stream, inputted from the data path switch 308, to a PCM decoder 311 when receiving the Disable signal from the comparator 307, and to output a silence PCM stream inputted from a silence PCM inserter 310, to the PCM decoder 311 when receiving the Enable signal.

In other words, when a voice PCM stream is being received, the received PCM stream is forwarded to the PCM decoder 311 via the data path switches 308 and 309. On the other hand, when a data PCM stream is being received, the received PCM stream is forwarded to the serial-to-parallel data converter 312 via the data path switch 308, and at the same time, a silence PCM stream is forwarded to the PCM decoder 311 via the data path switch 309. That is, it is determined by the above-mentioned MSB detector 304, counter 305, controller 306, and comparator 307, whether the received PCM stream is voice or data (the details will be described later.)

The silence PCM inserter 310 outputs PCM codes "00h" equivalent to a silent level, or a silent stream, in synchronization with the frame signal $S_F$ and 8-bit reception timing signal $S_{R8}$ fed from the timing signal generator 302. Alternatively, it may also be possible that the signal level is set to 0 V all the time by using a pull-down resistor.

The PCM decoder 311 decodes the PCM stream inputted from the data path switch 309, in synchronization with the frame signal $S_F$ and 8-bit reception timing signal $S_{R8}$ fed from the timing signal generator 302. As described above, when the transmitting-side terminal 10 has transmitted voice, the data path switch 309 outputs the received PCM stream, and therefore the voice signal from the transmitting-side is decoded. When the transmitting-side terminal 10 has transmitted data, the data path switch 309 outputs the silence PCM stream inputted from the silence PCM inserter 310, and therefore the silent voice signal is decoded.

Noise occurring when switching from a conversation state to a data receiving state is of no consequence in practice because it takes approximately 0.04 seconds from the MSB detection to the data path switching.

Serial-to-Parallel Data Conversion

In synchronization with the frame signal $S_F$ fed from the timing signal generator 302 and the 7-bit reception timing signal $S_{R7}$ fed from the MSB timing decimator 303, the serial-to-parallel data converter 312 creates 8-bit parallel data from consecutive multiframes of the received PCM stream inputted from the data path switch 308. Specifically, the serial-to-parallel data converter 312 receives the 8-bit PCM stream, which has been created by the transmitting-side terminal 10, in which the most significant bits are "1" and the remaining seven bits are significant data. The serial-to-parallel data converter 312 then selects only the significant data from the consecutive multiframes in accordance with the 7-bit reception timing signal $S_{R7}$, and rearranges into 8-bit parallel data. Accordingly, from the viewpoint of transmission data, 8-bit parallel data is converted into 7-bit serial data at the transmitting-side terminal 10, and the 7-bit serial data is inversely converted into the 8-bit parallel data at the receiving-side terminal 30.

It should be noted that the function of each block in FIG. 2 can be configured with hardware. However, the functions can also be implemented with software, using a program-controlled processor such as a CPU. Hereinafter, a detailed description will be given of an operation of determining voice/data reception, which is executed by a voice/data reception determination program running on a CPU.

Voice/Data Reception Determination

Figure 3:
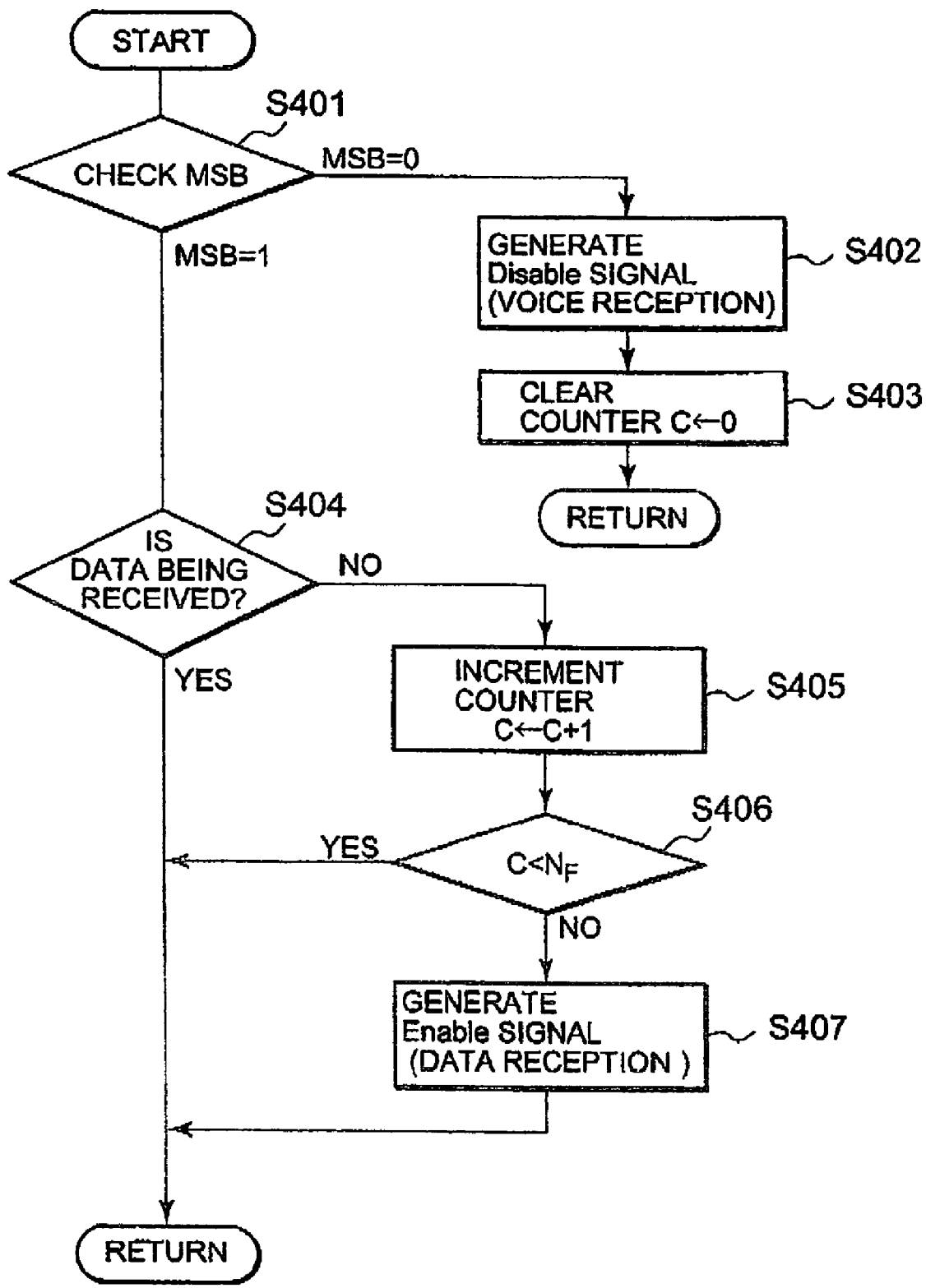
FIG. 3 is a flowchart showing an example of a method of determining a communication mode, in the first embodiment of the present invention.

FIG. 3 is a flowchart showing a method of determining a communication mode according to the first embodiment of the present invention. As described hereinbefore, the determination of voice or data is possible by utilizing the fact that it does not occur, in an 8-bit PCM stream obtained by PCM-encoding a voice signal, that the polarity-indicating most significant bits are consecutively 1s in a given number $N_F$ or more of frames. Incidentally, the given number $N_F$ of frames can be determined based on the following expression: $N_F=(1/\text{lowest voice-band frequency})/(1/\text{sampling frequency})/2$. In this embodiment, since the lowest voice-band frequency is 300 Hz and the sampling frequency is 8 kHz, the number $N_F$ is determined to be 14.

The voice/data receiving mode determination as shown in FIG. 3 is executed for each frame of a received PCM stream. First, the most significant bit MSB of a PCM code in each frame is checked (step S401). When MSB=0, the state is in voice conversation. Therefore, a Disable signal is outputted to each of the data path switches 308 and 309, and the received PCM stream is forwarded to the PCM decoder 311 (step S402). Then, the counter is reset to 0 (step S403).

When MSB=1, it is determined whether or not data is being received (step S404). When data is being received (step S404: YES), the reception processing is continued. When data is not being received (step S404: NO), it is determined whether or not most significant bits are consecutively is in at least the given number $N_F$ of frames, in order to certainly determine whether or not the reception of new data is going to start (steps S405, S406).

More specifically, when data is not being received (S404: NO), the counter is incremented (step S405), and then it is determined whether or not the count value C is less than the given number $N_F$ (step S406). When C<$N_F$ (step S406: YES), the most significant bit MSB in the next frame is checked as described in the steps S401 to S404.

In this way, MSB checking is carried out for each frame. When MSB=1, every time it is determined that data is not being received (step S404: NO), the counter is incremented (step S405). When the count value C becomes equal to or more than the given number $N_F$ (step S406: NO), it is determined that the state is in data communication. Then, an Enable signal is outputted to each of the data path switches 308 and 309, a subsequently received PCM stream is forwarded to the serial-to-parallel data converter 312, and a silence PCM stream is outputted to the PCM decoder 311 (step S407).

Once data reception is thus started, the received PCM stream is continuously forwarded to the serial-to-parallel data converter 312 because the most significant bits of PCM codes are "1" in the subsequent frames (step S401: MSB=1, and step S404: YES).

When the data transmission is completed and a PCM stream of voice conversation is received, the most significant bit becomes 0 (step S401: MSB=0). Therefore, a Disable signal is outputted to each of the data path switches 308 and 309, and the received PCM stream is forwarded to the PCM decoder 311 (step S402). In addition, the counter is cleared (step S403). Note that, since there might be an erroneous most significant bit due to noise or the like, the processing at steps S402 and S403 may be executed only after the determination that MSB=0 is made a predetermined number of times in succession at step S401.

As described above, in the data transmission system according to this embodiment, the most significant bit of an 8-bit PCM code is regarded as a communication mode switching control signal, and a bit stream made of the remaining seven bits is recognized as significant data. This makes communication mode switching and data transmission possible within a bandwidth for voice communication secured on the digital switching network 20 without using control channels of the network, avoiding increased traffic on the network.

The system and the method according to the present invention is particularly effective in transmission of instant message data, which are heavily used by mobile telephones and the like, as well as in transmission of control data to equipment to be controlled that requires relatively high immediacy, such as a remote camera or speaker connected to a remote terminal.

In addition, as described above, a PCM voice signal at frequencies below 300 Hz is regarded as being in data communication, and the silence codes (PCM codes "00h") are reproduced by the PCM decoder 311. This functions as a band stop filter for received voice signals.

(3) Other Applications

Figure 4:
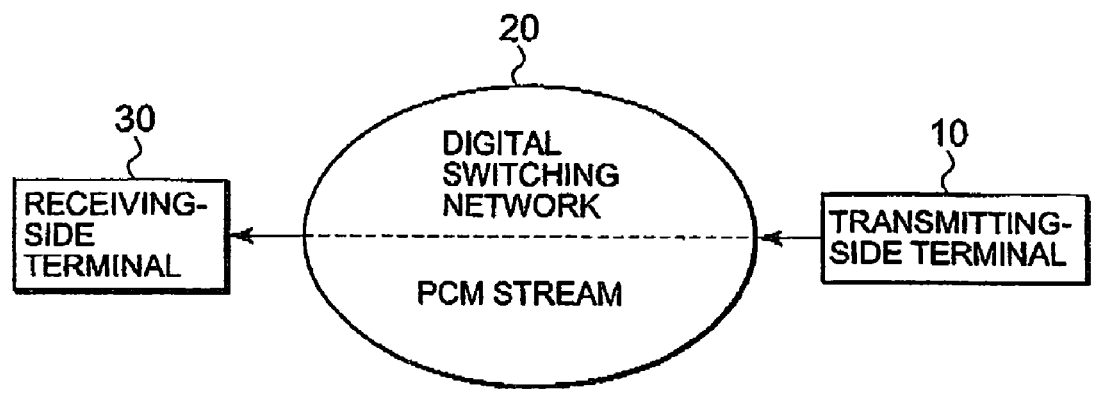
FIG. 4 is a schematic diagram of a communications system to which the first embodiment of the present invention is applied.

FIG. 4 is a schematic diagram of a communications system to which the first embodiment of the present invention is applied. A PCM stream as described above is transmitted from the transmitting-side terminal 10 to the receiving-side terminal 30 through a line over the digital switching network 20. However, the application of the present invention is not limited to such a digital switching network, and the present invention can also apply to a VoIP network.

Figure 5:
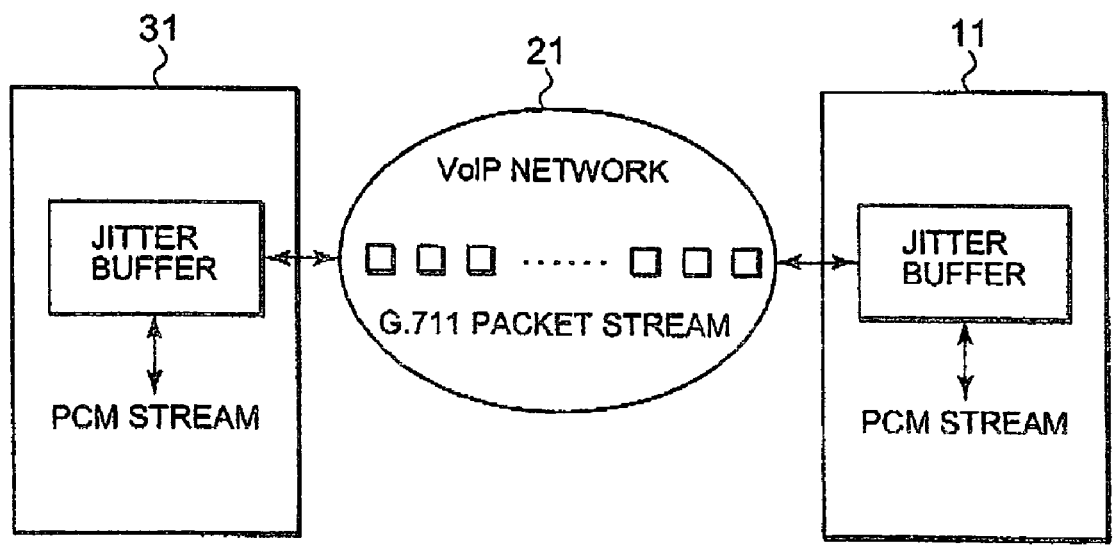
FIG. 5 is a schematic diagram of another communications system to which the first embodiment of the present invention is applied.

FIG. 5 is a schematic diagram of another communications system to which the first embodiment of the present invention is applied. Terminals 11 and 31 are connected to each other through a VoIP network 21, and voice and data are transmitted and received using a G. 711 packet stream. In this system, each of the terminals 11 and 31 is provided with a jitter buffer, which absorbs jitter and the like of each packet, and a converter, which converts a PCM stream to packets or vice versa. The other configuration of this system related to the transmission/reception of a PCM stream is basically the same as those described in conjunction with FIGS. 1 and 2, and similar effects can be achieved. Therefore, a description thereof will be omitted.

Moreover, in the aforementioned embodiment, the description is given of the case where the polarity bit of a PCM code is the most significant bit thereof. However, it is needless to say that the present invention can similarly apply to a case where the polarity bit is the least significant bit. In addition, when data is transmitted, "1" is used for the polarity bit in the aforementioned embodiment, but the use of "0" can achieve similar effects.

Further, in the aforementioned embodiment, the description is given of the case of an 8-bit PCM code. However, the present invention is not limited to such 8-bit PCM code, which can be applied to a system of an n-bit PCM stream where n is an arbitrary positive integer.

The invention claimed is:

1. A method for transmitting PCM (pulse Code Modulation)-based data from a transmitting terminal to a receiving terminal through a network, comprising:
at the transmitting terminal,
transmitting a PCM stream composed of a plurality of PCM codes;
when inputting data to be transmitted, transmitting a predetermined number of consecutive PCM codes to the receiving terminal, wherein a polarity bit of each PCM code is fixed to a predetermined logic value;
at the receiving terminal,
when receiving a PCM stream from the transmitting terminal, determining whether the polarity bit of each PCM code in a received PCM stream is the predetermined logic value; and
after the polarity bits of the predetermined number of consecutive PCM codes in the received PCM stream are the predetermined logic values, rearranging bit data other than the polarity bit in each PCM code of the received PCM stream into received data.

2. A method for transmitting PCM (pulse Code Modulation)-based data from a transmitting terminal to a receiving terminal through a network, comprising:
at the transmitting terminal,
inputting data to be transmitted;
generating a data PCM stream composed of PCM codes with each PCM code having a polarity bit fixed to a predetermined logic value and the remaining bits to which the data to be transmitted are sequentially allocated;
transmitting the data PCM stream to the receiving terminal;
at the receiving terminal,
receiving a PCM stream from the transmitting terminal;
determining whether the polarity bit of each PCM code in a received PCM stream is the predetermined logic value; and
when the polarity bit of the PCM code in the received PCM stream is the predetermined logic value, rearranging bit data other than the polarity bit in the PCM code of the received PCM stream into received data.

3. The method according to claim 2, further comprising:
at the transmitting terminal,
when inputting the data to be transmitted, generating a PCM stream composed of a predetermined number of PCM codes, each of which has a polarity bit thereof fixed to the predetermined logical valuer to transmit the PCM stream to the receiving terminal;
after having transmitted the PCM stream composed of the predetermined number of PCM codes, transmitting the data PCM stream to the receiving terminal;
at the receiving terminal,
counting a number of consecutive PCM codes in the received PCM stream, wherein each of the consecutive PCM codes has its polarity bit fixed to the predetermined logical value; and
when the number of consecutive PCM codes is not smaller than a predetermined number, rearranging bit data other than the polarity bit in the PCM code of a subsequently received PCM stream to produce the received data.

4. The method according to claim 2, further comprising:
at the transmitting terminal,
when the data to be transmitted has been completely transmitted, transmitting a PCM stream composed of PCM codes, each of which has a polarity bit of a logical value other than the predetermined logical value, to the receiving terminal;
at the receiving terminal,
when a polarity bit of at least one PCM code on a consecutive basis in the received PCM stream indicates a logical value other than the predetermined logical value, performing PCM-decoding of the received PCM stream.

5. The method according to claim 3, further comprising:
at the transmitting terminal,
when the data to be transmitted has been completely transmitted, transmitting a PCM stream composed of PCM codes, each of which has a polarity bit of a logical value other than the predetermined logical value, to the receiving terminal;
at the receiving terminal,
when a polarity bit of at least one PCM code on a consecutive basis in the received PCM stream indicates a logical value other than the predetermined logical value, performing PCM-decoding of the received PCM stream.

6. A transmitting terminal for transmitting data to a receiving terminal using a PCM (pulse Code Modulation) stream, comprising:
at the transmitting terminal,
a PCM encoder for encoding an input analog signal to produce a first PCM stream composed of PCM codes, each of which includes a polarity bit;
a data converter for converting input data to be transmitted into pseudo PCM serial data by sequentially allocating bits of the input data to bits of the pseudo PCM serial data other than a bit corresponding to the polarity bit;
a selector for selecting one of the first PCM stream and the pseudo PCM serial data;
a bit inserter for inserting a predetermined logical value into a bit position corresponding to the polarity bit of the pseudo PCM serial data selected by the selector, to generate a second PCM stream; and
a transmitter for transmitting the first PCM stream and the second PCM stream to a destination.

7. The transmitting terminal according to claim 6, wherein the bit inserter generates a PCM stream composed of a predetermined number of PCM codes with each PCM code including a polarity bit fixed to the predetermined logic value when a request for transmitting the input data occurs, and
the transmitter transmits the PCM stream composed of the predetermined number of PCM codes to the destination.

8. The transmitting terminal according to claim 6, wherein the bit inserter stops inserting the predetermined logical value into a bit position corresponding to the polarity bit when the input data to be transmitted has been completely transmitted.

9. A receiving terminal for receiving a PCM (pulse Code Modulation) stream, comprising:
a receiver for receiving a PCM stream composed of a plurality of PCM codes;
a determiner for determining whether a polarity bit of each PCM code in a received PCM stream is a predetermined logic value; and
a data converter for converting each PCM code into received data by rearranging data other than the polarity bit in the PCM code of the received PCM stream;
a PCM decoder for decoding the received PCM stream; and
a switch for transferring the received PCM stream to the data converter when the polarity bit of the PCM code in the received PCM stream is the predetermined logic value, and to the PCM decoder when a polarity bit of at least one PCM code on a consecutive basis in the received PCM stream is a logical value other than the predetermined logical value.

10. The receiving terminal according to claim 9, wherein the determiner comprises:
a counter for counting a number of consecutive PCM codes in the received PCM stream, wherein each of the consecutive PCM codes has its polarity bit fixed to the predetermined logical value; and
a comparator for comparing a count value of the counter with a predetermined number,
wherein the switch transfers the received PCM stream to the PCM decoder when the number of consecutive PCM codes is smaller than the predetermined number, and transfers it to the data converter when the number of consecutive PCM codes is not smaller than the predetermined number.

11. A method for switching a communication mode between a first communication mode and a second communication mode in a data transmission system in where a transmitting terminal transmits data to a receiving terminal through a network using a PCM (pulse Code Modulation) stream, comprising:
at the transmitting terminal,
encoding an input analog signal to produce a first PCM stream composed of PCM codes, each of which includes a polarity bit;
generating a second PCM stream, which is composed of PCM codes with each PCM code including a polarity bit fixed to a predetermined logic value, by sequentially allocating bits of input data to be transmitted to bits of each PCM code other than a bit corresponding to the polarity bit;
when the input data to be transmitted is generated, generating a PCM stream composed of a predetermined number of consecutive PCM codes, each of which has the polarity bit set to the predetermined logic value;
after having transmitted the PCM stream composed of the predetermined number of consecutive PCM codes to the receiving terminal, switching a transmission stream from the first PCM stream to the second PCM stream;
at the receiving terminal,
receiving a PCM stream composed of a plurality of PCM codes;
determining whether a polarity bit of each PCM code in a received PCM stream is the predetermined logic value; and
counting a number of consecutive PCM codes in the received PCM stream, wherein each of the consecutive PCM codes has its polarity bit fixed to the predetermined logical value; and
when the number of consecutive PCM codes is smaller than a predetermined number, PCM-decoding the received PCM stream; and
when the number of consecutive PCM codes is not smaller than the predetermined number, rearranging bit data other than the polarity bit in each PCM code of a subsequently received PCM stream to produce received data.

12. A transceiver terminal comprising a transmitting section and a receiving section, which are used for PCM-based data transmission and reception, wherein
the transmitting section comprises:
a PCM encoder for encoding an input analog signal to produce a first PCM stream composed of PCM codes, each of which includes a polarity bit;
a data converter for converting input data to be transmitted into pseudo PCM serial data by sequentially allocating bits of the input data to bits of the pseudo PCM serial data other than a bit corresponding to the polarity bit;
a selector for selecting one of the first PCM stream and the pseudo PCM serial data;
a bit inserter for inserting a predetermined logical value into a bit position corresponding to the polarity bit of the pseudo PCM serial data selected by the selector, to generate a second PCM stream; and
a transmitter for transmitting the first PCM stream and the second PCM stream to a destination, and the receiving section comprises:
- a receiver for receiving a PCM stream composed of a plurality of PCM codes;
- a determiner for determining whether a polarity bit of each PCM code in a received PCM stream is a predetermined logic value; and
- a data converter for converting each PCM code into received data by rearranging data other than the polarity bit in the PCM code of the received PCM stream;
- a PCM decoder for decoding the received PCM stream; and
- a switch for transferring the received PCM stream to the data converter when the polarity bit of the PCM code in the received PCM stream is the predetermined logic value, and to the PCM decoder when a polarity bit of at least one PCM code on a consecutive basis in the received PCM stream is a logical value other than the predetermined logical value.

* * * * *